US005426516A

United States Patent [19]

Furuki et al.

[11] Patent Number: 5,426,516

[45] Date of Patent: Jun. 20, 1995

[54] COLOR IMAGE PROCESSING APPARATUS

[75] Inventors: Tsuneo Furuki, Yamato; Yasuo Itoh, Yokohama; Akiyoshi Hamanaka, Hachioji; Kyojiro Sei; Kazuo Hikawa, both of Yokohama, all of Japan

[73] Assignee: Victor Company of Japan, Ltd., Yokohama, Japan

[21] Appl. No.: 291,736

[22] Filed: Aug. 17, 1994

Related U.S. Application Data

[63] Continuation of Ser. No. 912,495, Jul. 13, 1992, abandoned.

[30] Foreign Application Priority Data

Jul. 15, 1991 [JP] Japan ................................ 3-199994

[51] Int. Cl.⁶ ................................ G03F 3/08

[52] U.S. Cl. ................................ 358/500; 358/518; 358/520

[58] Field of Search ................ 358/75, 80, 78, 526, 358/525, 530, 453, 518, 448; 364/518; 345/201, 199, 113, 114, 115

[56] References Cited

U.S. PATENT DOCUMENTS 4,625,234 9/1983 Yamada ................................ 358/78
4,710,806 6/1986 Iwai ................................ 358/81
4,951,132 9/1988 Nakade ................................ 358/78

OTHER PUBLICATIONS

Ser. No. 485,547 filed Feb. 22, 1990 Assignee: Victor Company of Japan, Ltd.
Service Manual #11341 for the Model VS-G11 CD Graphic Processor issued Nov. 1988 by Victor Company of Japan, Ltd.

*Primary Examiner*—Edward L. Coles, Sr.
*Assistant Examiner*—John Ning
*Attorney, Agent, or Firm*—Michael N. Meller

[57] ABSTRACT

Color image processing apparatus for displaying color images comprised of terminals for receiving pixel data and control data, first and second frame memories for storing the pixel data of 2 picture frames of image to be displayed, and first and second color look-up tables provided correspondingly with the first and second frame memories for storing color data to be referred by the pixel data in the first and second frame memories, which color data are determined individually between the first and second color look-up tables. The apparatus further comprises a control and output device for controlling arrangements of the first and second frame memories and the first and second look-up tables concurrently, and determining the color data to be stored individually in the first and second color look-up tables and outputting color pixel data determined according to the pixel data in the first and second frame memories and the color data in the first and second look-up tables in response to the control data inputted thereto.

Further in detail, the control data cause the control and output device to combine the first and second frame memories so as to operate as a single unit and to make up a third look-up table having at least a color data domain equivalent to the first look-up table.

2 Claims, 4 Drawing Sheets

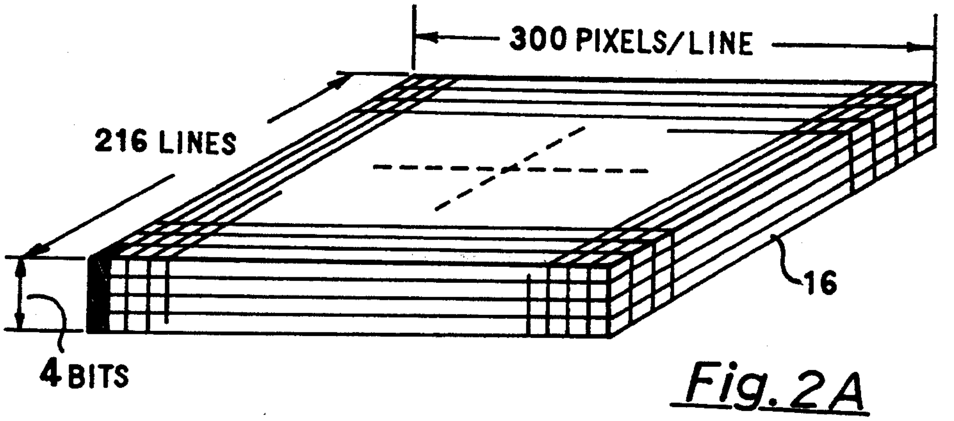
Fig. 2A
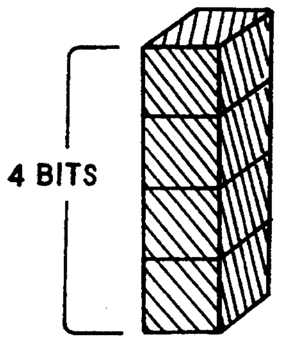
Fig. 2B
| COLOR NUMBER | PIXEL DATA | COLOR ELEMENT DATA | | |
|---|---|---|---|---|
| | | R | G | B |
| 0 | 0000 | R000 | G000 | B000 |
| 1 | 0001 | R001 | G001 | B001 |
| 2 | 0010 | R002 | G002 | B002 |
| 3 | 0011 | R003 | G003 | B003 |
| 4 | 0100 | R004 | G004 | B004 |
| 5 | 0101 | R005 | G005 | B005 |
| 6 | 0110 | R006 | G006 | B006 |
| 7 | 0111 | R007 | G007 | B007 |
| 8 | 1000 | R008 | G008 | B008 |
| 9 | 1001 | R009 | G009 | B009 |
| 10 | 1010 | R010 | G010 | B010 |
| 11 | 1011 | R011 | G011 | B011 |
| 12 | 1100 | R012 | G012 | B012 |
| 13 | 1101 | R013 | G013 | B013 |
| 14 | 1110 | R014 | G014 | B014 |
| 15 | 1111 | R015 | G015 | B015 |
Fig. 2C 20
| COLOR NUMBER | COLOR ELEMENT DATA R | G | B |
|---|---|---|---|
| 0 | R000 | G000 | B000 |
| 1 | R001 | G001 | B001 |
| 2 | R002 | G002 | B002 |
| ⋮ | · | · | · |
| 14 | R014 | G014 | B014 |
| 15 | R015 | G015 | B015 |
| 16 | R016 | G016 | B016 |
| ⋮ | · | · | · |
| 126 | R126 | G126 | B126 |
| 127 | R127 | G127 | B127 |
| 128 | R128 | G128 | B128 |
| ⋮ | · | · | · |
| 141 | R141 | G141 | B141 |
| 142 | R142 | G142 | B142 |
| 143 | R143 | G143 | B143 |
| ⋮ | · | · | · |
| 254 | R254 | G254 | B254 |
| 255 | R255 | G255 | B255 |
20A
20B
Fig. 4C
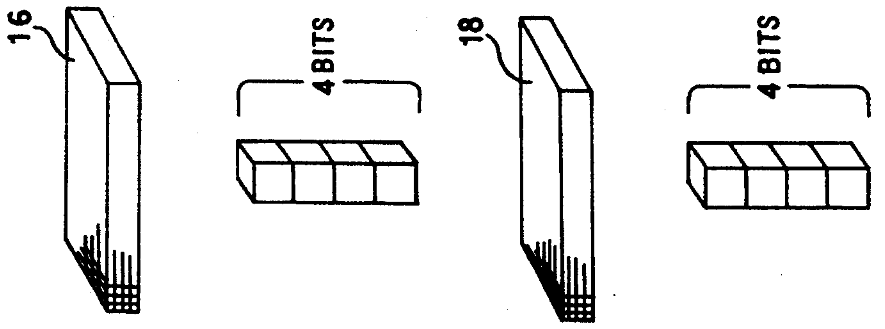
Fig. 4B
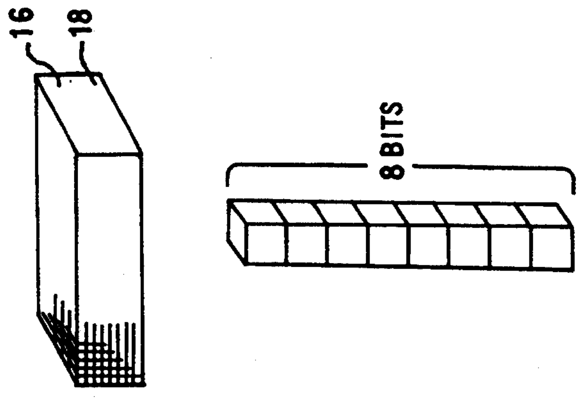
Fig. 4A

COLOR IMAGE PROCESSING APPARATUS

This application is a continuation of application Ser. No. 07/912,495, filed Jul. 13, 1992 now abandoned.

BACKGROUND OF THE INVENTION

1. Field of the Invention

The present invention relates to a color image processing apparatus which provides improved color image for such applications as CD-Graphics displays by utilizing a new form of color look up table.

2. Description of the Prior Art

CD-Graphics is a system in which sound is combined with still-picture images, and is often used for a KARAOKE(sing along) entertainment. However, the CD-Graphics has some deficiencies as follows:

1) Colors possible to be displayed are limited to 16 colors, thus color reproduction and gradation are poor.
2) Slow picture change due to its low data transfer rate
3) Monotonous picture change since the picture replacement process performed on the same memory layer.

These deficiencies make the CD-Graphics system less attractive or versatile as a media for carrying image information, as a matter of fact, the softwares issued in this format are still very limited. In this regard, the present invention is directed to offer color image processing apparatus capable of presenting more interesting and full variety color images.

SUMMARY OF THE INVENTION

A primary object of the present invention is to overcome such deficiencies as described in the foregoing, and to achieve an improved color image processing apparatus for displaying color images.

According to one concept of the present invention, there provided in an apparatus, terminals for receiving pixel data and control data, first and second frame memories for storing the pixel data of 2 picture frames of image to be displayed, and first and second color look-up tables arranged correspondingly with the first and second frame memories for storing color data to be referred by the pixel data in the first and second frame memories, which color data are determined individually between the first and second color look-up tables. The apparatus is further provided with a control and output device for controlling arrangements of the first and second frame memories and the first and second look-up tables concurrently, and determining the color data to be stored individually in the first and second color look-up tables and outputting color pixel data determined according to the pixel data in the first and second frame memories and the color data in the first and second look-up tables in response to the control data inputted thereto.

Further in detail, the control data cause the control and output device to combine the first and second frame memories so as to operate as a single unit and to make up a third look-up table having at least a color data domain equivalent to the first look-up table.

The invention and its advantages will be best understood from the following detailed description when read in connection with the accompanying drawings.

BRIEF DESCRIPTION OF THE DRAWINGS

FIG. 2 is for explaining a basic relationship between a color look up table and a frame memory in the present embodiment of FIG. 1.

FIG. 4 shows a relationship between a color look up table and a frame memory in two different operating modes of the present embodiment of FIG. 1.

DETAILED DESCRIPTION OF THE PREFERRED EMBODIMENT

Color image processing apparatus according to the present invention will be described in detail with reference to the accompanying drawings.

Figure 1:
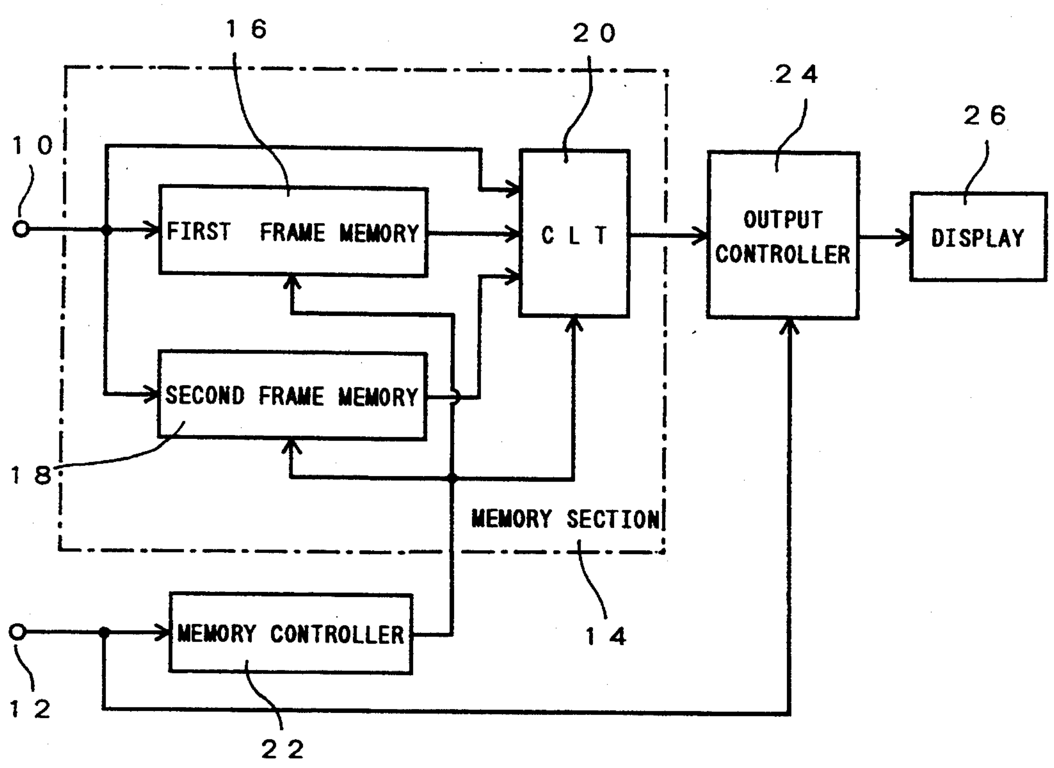
FIG. 1 is a schematic diagram of color image processing apparatus according to an embodiment of the present invention.

FIG. 1 is a schematic representation-of a color image processing apparatus according to an embodiment of the present invention in which a terminal 10 is connected to an input of a memory section 14 which includes a first and a second frame memories 16 and 18 respectively, and further includes a color look up table, hereinafter referred to as "CLT" 20, or 20A and/or 20B depending on an operating mode thereof. A terminal 12 is connected to an input of a memory controller 22 and also to an input of an output controller 24 which has 2 other inputs being connected to 2 corresponding outputs of the memory section 14. Further, an output of the output controller 24 is connected to an input of a display 26. The terminal 10 is supplied with pixel data of image and CLT data from an instruction processing part (not shown) of CD reproduction section (not shown). The terminal 12 is supplied with control data for image displays from the CD reproduction section. In order not to read as erroneous data by conventional CD Graphics systems, signal formats for commands and correction data in this embodiment, are made as such that they are not accepted by conventional models of the CD Graphics systems. In practice, the subcodes of "R" to "W" are maintained in the conventional format, and major pixel data, CLT data, preset and scroll commands, are used as MODE 1, ITEM 1 like in the conventional types.

However, a command for scene change which is an extension of this embodiment and data for improving an image quality, are provided in the MODE 1, ITEM 2 in a vacant region of the "R" to "W" channels. As a result, the softwares produced according to the signal format of this embodiment, are playable on the conventional playback systems, and the softwares of conventional signal format are playable on the playback systems of this embodiment, thus a two-way compatibility is achieved.

Figure 3A:
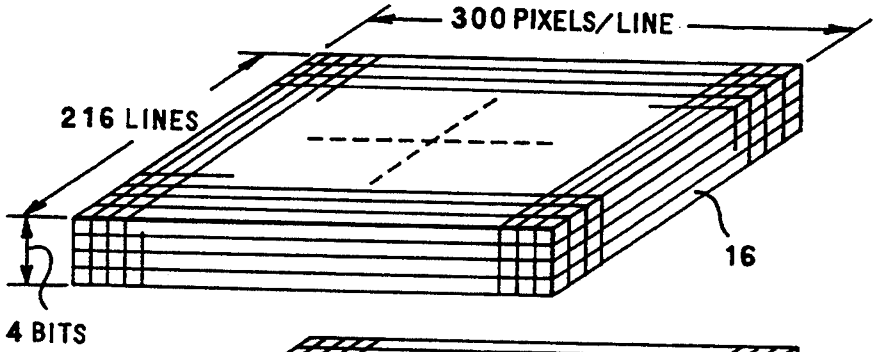
FIG. 3 shows configurations of 2 frame memories shown in FIG. 1 and a case where the 2 frame memories are operated together as a single unit.
Figure 3B:
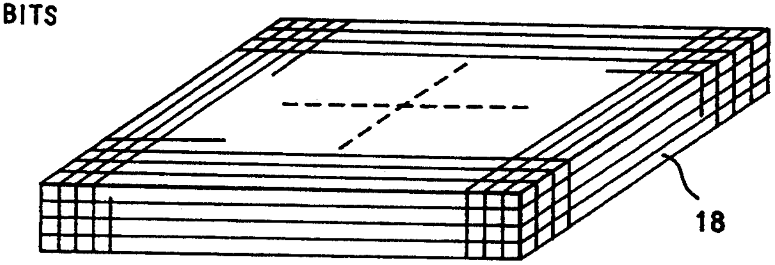
Figure 3C:
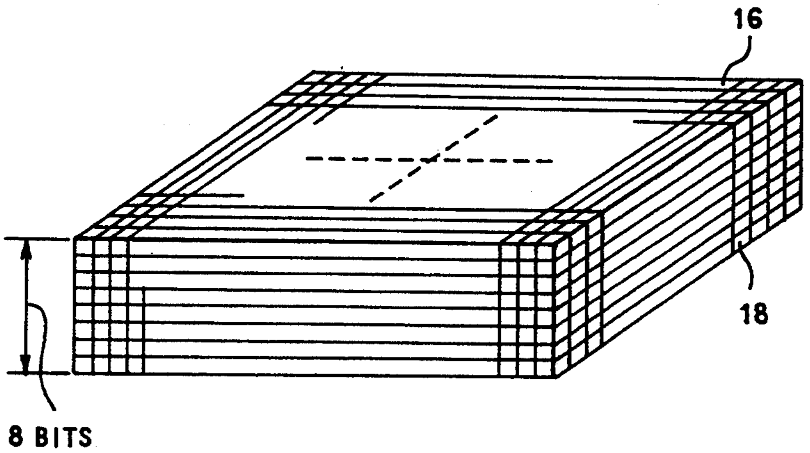

The first and second frame memories 16 and 18 included in the memory section 14, are arranged to correspond with a displayed image on the display 26 as shown in FIG. 2A, in which pixels of 300 per line by 216 lines are respectively laid out horizontally and vertically, and one(1) pixel datum is represented by a 4-bit capacity as shown in FIG. 2B. In this embodiment, as described before, the 2 frame memories i.e. the first and second frame memories 16 and 18 are provided separately, FIGS. 3A and 3B illustrate such configuration, and in a normal operation mode to be explained later, each of the first and second frame memories is operated individually, however, in an extended operation mode which will be also explained later, the first and second frame memories 16 and 18 operate together as an integrated single unit as shown in FIG. 3C and one(1) pixel datum is represented by an 8-bit capacity.

In the CLT 20, color data which can be designated by the pixel data stored in the first and second frame memories 16 and 18, are stored. The CLT 20 changes its operating mode as explained before. In the extended operation mode, each of the pixel data is represented by 8 bits which enable a color representation of $2^8=256$. FIGS. 4A and 4C explain this configuration where 8-bit color data i.e. a color number 0 to a color number 255, are prepared in the CLT 20 which is a combination of the first and second CLTs 20A and 20B united to operate as a third CLT.

As an example, a pixel datum [00000000] (not shown in FIG. 4C ) designates a color No. 0 which specifies RGB color element data represented as [R000, G000, B000], in other words, the color No. 0 to be designated by the pixel datum [00000000], is predetermined by a combination of [R000, G000, B000], the same is true to other pixel data.

On the other hand, in the normal operation mode, one(1) pixel datum is represented by a 4-bit capacity as shown in FIG. 4B, thus it enables a color representation of $2^4=16$. In this case, 16 color data of color No. 0 to color No. 15 shown in FIG. 4C, are prepared in CLT 20A which corresponds to the first frame memory 16, and another 16 color data of color No. 128 to Color No. 143 of FIG. 4C, are stored in CLT 20B which corresponds to the second frame memory 18. A relationship between a pixel datum and the CLT 20 for the first frame memory 16 is shown in FIG. 2B and FIG. 2C.

Each of the RGB color element data (RXXX, GXXX, BXXX) can represent a number of bits which may be determined as desired, but in this embodiment, 6 bits are utilized in the extended operation mode and upper 4 bits out of the 6 bits are utilized in the normal operation mode.

Data value of each of the RGB color element data can be revised in response to the control data transmitted from a CD side, for example, [R004, G004, B004] may correspond to "black" or "blue", or a plurality of different color numbers may correspond to a same color. All of such are designated from the CD side.

Data input and output to and from the memory section 14 are controlled by the memory controller 22, and pixel data of image, CLT data and other control data are obtained from the CD reproduction section by instruction processings of the reproduced data. Writing these data into the first and second frame memories 16 and 18 and the CLT 20 ( 20A, 20B), and reading 4-bit or 8-bit pixel data from the first and second frame memories 16 and 18, and reading color data corresponding to the read out pixel data from the CLT 20, are all controlled by the memory controller 22 based on the control data transmitted from the CD side.

Output controller 24 is provided for controlling a color data output from the memory section 14 in response to control data, and a display 26 such as CRT is provided for displaying an image based on the output color data by being referred to the CLT 20.

Next, operation of the embodiment of present invention will be explained.

1. Operation of Conventional Format

FIG. 2 illustrates how a software reproduction of conventional format is performed in this embodiment. The pixel data transmitted from the CD side are stored in the first frame memory 16 for instance, the CLT data are respectively stored at addresses of color numbers 0 to 15 of the CLT 20A for example, and the color data corresponding to the pixel data read out from the first frame memory 16, are read out from the CLT 20A and displayed on the display 26. Accordingly, an image stored in the first frame memory 16 is displayed in color.

2. Operation in Normal Operation Mode

Basic operation in the normal operation mode is similar to the above conventional format operation except that in this embodiment, the following sophisticated image processing for a scene change is possible because of the fact that there provided two frame memories 16 and 18 having a capacity of 1 image (picture) each. In this case, a picture "A" and a picture "B" which replaces subsequently the picture "A" as the scene change, are preliminary stored in the first and the second frame memories 16 and 18 respectively. In the following explanation, the scene change takes place from the picture "A" in the first frame memory 16 to the picture "B" in the second frame memory 18.

1) CUT

First, the picture "A" is displayed on the display 26 as such that pixel data stored in the first frame memory 16 are read out and inputted to the CLT 20A, subsequently from the CLT 20A, corresponding color data are outputted to the display 26 through the output controller 24. Then, upon receiving a [CUT] command from the CD side through the terminal 12, the memory controller 22 switches the first frame memory 16 to the second frame memory 18 concurrently with a switching of CLT 20A to CLT 20B. In turn, pixel data stored in the second frame memory 18 are read out and inputted to the CLT 20B, subsequently from the CLT 20A, corresponding color data are outputted to the display 26 through the output controller 24. This results in switching quickly the picture "A" to the picture "B" on the screen of display 26.

2) DISSOLVE (cross-fade)

The picture "A" is displayed first on the display 26 in the same process as for the "CUT" process described before. When [DISSOLVE] commands from the CD side through the terminal 10 and 12 are inputted to the memory controller 22 and the output controller 26 and the CLTs 20A and 20B, the memory controller 22, in response to instructions from the CD side, revises color data in the CLT 20B to "black" with data sent from the CD side through the terminal 10 where the color data to be revised correspond to the picture "B" (not being displayed) of the second frame memory 18. Thereafter in the output controller 24, the color data read from the CLT 20A based on the pixel data in the first frame memory 16 and the picture "B" of black only are added each other resulting in the picture "A" being displayed.

Under this status, color data of respective color numbers defined in the CLT 20A, are replaced progressively from the inherent values (original colors) to "black" by the memory controller 22 in response to successive instructions given from the CD side. On the other hand in the CLT 20B, color data of respective color numbers are replaced progressively from "black"

to the inherent values (original colors) by the memory control let 22 in response to successive instructions given from the CD side. Now description is given to the currently displayed picture "A" of the first frame memory 16, when the picture "A" is dissolved in 8 increments, the color data in the CLT 20A is so revised that the color brightness of level "8" represented by the color data in the CLT 20A is decreased incrementally to total black as 8→7→6→5→4→3→2→1→0, the color brightness of level "4", for example, is reduced to total black as 4→4→3→3→2→2→1→1→0, the same is true to other color data. As explained above, the color data at their respective positions in the CLT 20A are reduced in brightness progressively at every increment. Accordingly, the brightness of the picture "A" being displayed is seemingly dimmed progressively to total black thus the picture "A" dissolves eventually. On the other hand, so far as the picture "B" is concerned, the color data revisions are implemented reversely to the process for the picture "A" i.e. the color data representing respective brightness levels are revised so that the brightness is progressively increased and finally all of the color data in the CLT 20B have their inherent color values as the picture "B" is displayed replacing the picture ∓A". The above incremental picture "A" fade out and picture "B" fade in take place concurrently on the display 26, during which, owing to the data capacity, the color data revision in the CLTs 20A and 20B is performed quicker than the pixel data revision in the first and second frame memories 16 and 18.

After the aforementioned process, an output change-over is performed in the output controller 24 from a display status of the added picture to the output from the second frame memory 18 and the CLT 20B.

It should be noted that if the pixel data in the first and second frame memories 16 and 18 were revised directly to attempt the above "dissolve" effect, it would take much more time to complete the process and during which unintelligible intermediate pictures would appear on the display 26. In contrast, revising the color data in the CLTs 20A and 20B as in the present invention described above enables a quick picture switching thus more sophisticated picture presentations are possible.

3) EXTENDED OPERATION MODE

In the extended operation mode, the first and second frame memories are combined as shown in FIG. 3C to perform as a unified unit. One pixel datum is now represented by an 8-bit capacity enabling an image of 256 colors by the CLT 20.

As explained in the foregoing, according to the present invention, there provided 2 sets of frame memories (16 and 18) and the first and second CLTs 20A and 20B correspondingly with the 2 frame memories (16, 18), which are utilized effectively as such that the two frame memories (16 and 18) are operated individually in the normal operation mode, whereas in the extended operation mode, the 2 frame memories (16, 18) are operated together as a single unit with a third CLT (20 . . . CLT 20A combined with CLT 20B) in which the color data in the first CLT (20A) are held with a priority. This enables the compatibility with conventional systems or as presenting a large color variety of pictures with sophisticated image processings including "CUT" and "DISSOLVE" effects.

Further, the present invention is not limited to the embodiment shown but following are included within the scope of the claims:

1) Operations of the embodiment are implemented by a micro-computer.
2) Explanation is given in an assumption that the CD-Graphics is extended to carry programs to be used in the present invention, but the invention is applicable to other image processing systems utilizing such CLTs as shown.
3) Various circuit arrangements are possible as such that the CLT 20 may consist of 1 or more ICs, or 1 LSI (large scale IC) including other circuits depending on the necessity. And such as color numbers, color data, color values can be different from those shown in the embodiment.

What is claimed is:

1. Color image processing apparatus for displaying color images on a single display comprising:

terminal means for receiving pixel data and control data, said pixel data being a series of picture frames including first and second picture frames;

first frame memory for storing a first pixel data group corresponding to said first picture frame;

second frame memory for storing a second pixel data group corresponding to said second picture frame;

first color look-up table provided correspondingly with said first frame memory for storing first color data group to be designated by said first pixel data group;

second color look-up table provided correspondingly with said second frame memory for storing second color data group to be designated by said second pixel data group;

output control means for performing a selective output control of said first and second color data groups designated respectively by said first and second pixel data groups and outputted respectively from said first and second color look-up tables and for displaying a selected one of said first and second color data groups on said display in response to said control data;

control means for controlling operations of said first and second frame memories together with said first and second color look-up tables in response to said control data in such a manner that said first frame memory and said first color look-up table are switched respectively and concurrently to said second frame memory and said second color look-up table so that said first color data group designated by said first pixel data group and being displayed by said output control means is replaced with said second color data group designated by said second pixel data group to perform a CUT effect upon said selective output control by said output control means.

2. Color image processing apparatus for displaying color images comprising:

terminal means for receiving pixel data and control data, said pixel data being a series of picture frames including first and second picture frames;

first frame memory for storing a first pixel data group corresponding to said first picture frame;

second frame memory for storing a second pixel data group corresponding to said second picture frame;

first color look-up table provided correspondingly with said first frame memory for storing first color data group to be designated by said first pixel data group;

second color look-up table provided correspondingly with said second frame memory for storing second color data group to be designated by said second pixel data group;

output control means for adding each other said first and second color data groups designated respectively by said first and second pixel data groups and outputted respectively from said first and second color look-up tables and for displaying thus added first and second color data groups in response to said control data;

control means for controlling operations of said first and second frame memories together with said first and second color look-up tables in response to said control data in such a manner that said second color data group to be designated by said second pixel data group is made black in response to said control data thereby said first color data group added to said second color data group made to black is displayed as a first picture by said output control means, thereafter, said first color data group to be designated by said first pixel data group is replaced progressively from a first value to black while said second pixel data group is replaced progressively from black to a second value in response to said control data thereby said second pixel data group replaced with said second value is displayed as a second picture by said output control means to perform a DISSOLVE effect between said first and second pictures.

* * * * *